United States Patent
Shimomura et al.

(10) Patent No.: US 7,189,340 B2
(45) Date of Patent: Mar. 13, 2007

(54) PHOSPHOR, LIGHT EMITTING DEVICE USING PHOSPHOR, AND DISPLAY AND LIGHTING SYSTEM USING LIGHT EMITTING DEVICE

(75) Inventors: Yasuo Shimomura, Yokohama (JP); Naoto Kijima, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 143 days.

(21) Appl. No.: 10/776,339

(22) Filed: Feb. 12, 2004

(65) Prior Publication Data

US 2004/0251809 A1    Dec. 16, 2004

(30) Foreign Application Priority Data

Aug. 28, 2001    (JP) .............................. 2001-257420

(51) Int. Cl.
*C09K 11/08*    (2006.01)
(52) U.S. Cl. .................. 252/301.4 F; 252/301.6 F; 257/98; 313/503
(58) Field of Classification Search ............... None
See application file for complete search history.

(56) References Cited

U.S. PATENT DOCUMENTS

| | | | | |
|---|---|---|---|---|
| 3,468,801 A | * | 9/1969 | Hall et al. ............... | 252/62.58 |
| 4,093,890 A | * | 6/1978 | Verriet et al. ............ | 313/486 |
| 2005/0093442 A1 | * | 5/2005 | Setlur et al. .............. | 313/512 |
| 2005/0156496 A1 | | 7/2005 | Takashima et al. | |

FOREIGN PATENT DOCUMENTS

| | | | |
|---|---|---|---|
| JP | 7-291799 | * | 11/1995 |
| JP | 2003-64358 | | 3/2003 |

OTHER PUBLICATIONS

Huh et al, "Optical Properties of Three-Band White Light Emitting Diodes", Journal of The Electrochemical Society, 150 (2) H57-H60 (2003).
Yamada et al, "Red-Enhanced White-Light-Emitting Diode Using a New Red Phosphor", Jpn. J. Appl. Phys. vol. 42 (2003) pp. L20-L23, Part 2, No. 1A/B Jan. 15, 2003.
Cavalli et al, "Optical properties of Cr-doped $Ca_3Sc_2Ge_3O_{12}$ single crystals", Optical Materials 6 (1996) 153-159.
Comini et al, "Optical spectroscopy and fluorescence dynamics of $Er^{3+}$ in $Ca_3Sc_2Ge_3O_{12}$ crystal", J. Opt. Soc. Am. B/vol. 14, No. 8, Aug. 1997.
High Output LED Light Source for Illumination of Gekkan Display, p. 43-44, Jan. 2004 (with summarized English translation).
Pinelli et al, J. Optical Materials, 25 (2004) pp. 91-99.

* cited by examiner

*Primary Examiner*—C. Melissa Koslow
(74) *Attorney, Agent, or Firm*—Oblon, Spivak, McClelland, Maier & Neustadt, P.C.

(57) ABSTRACT

A phosphor (A) comprising a host material composed of a compound having a garnet crystal structure represented by the general formula (I):

$$M^1_a M^2_b M^3_c O_d \qquad (I)$$

(wherein $M^1$ is a divalent metal element, $M^2$ is a trivalent metal element, $M^3$ is a tetravalent metal element containing at least Si, a is the number of 2.7 to 3.3, b is the number of 1.8 to 2.2, c is the number of 2.7 to 3.3, and d is the number of 11.0 to 13.0), and a luminescent center ion incorporated in the host material; a light emitting device (B) comprising the phosphor as a wavelength conversion material and a semiconductor light emitting element capable of emitting a light in the range of from ultraviolet light to visible light; and a display (C) and a lighting system (D) using the light emitting device (B) as a light source. The above phosphor can be readily produced, and can provide a light emitting device having a high color rendering property.

21 Claims, 2 Drawing Sheets

PHOSPHOR, LIGHT EMITTING DEVICE USING PHOSPHOR, AND DISPLAY AND LIGHTING SYSTEM USING LIGHT EMITTING DEVICE

TECHNICAL FIELD

The present invention relates to a phosphor, a light emitting device using the phosphor, and a display and a lighting system using the light emitting device. More particularly, the present invention relates to a phosphor including a host material compound and a luminescent center ion incorporated therein, which is useful as a wavelength conversion material capable of absorbing a light in the range of from ultraviolet light to visible light and emitting a visible light having a longer wavelength than that of the absorbed light, and can provide a light emitting device having a high color rendering property when used in combination with a semiconductor light emitting element such as light emitting diodes (LED) and laser diodes (LD), a light emitting device using such a phosphor, and a display and a lighting system using such a light emitting device as a light source thereof.

BACKGROUND ARTS

Hitherto, white light emitting devices constituted by the combination of a gallium nitride (GaN)-based blue light emitting diode as a semiconductor light emitting element and a phosphor as a wavelength conversion material have been noticed as a light emission source for displays or lighting systems because of a less consumption of electric power and a long service life thereof.

In the white light emitting devices, the phosphor used therein absorbs a blue-range visible light emitted from the GaN-based blue light emitting diode, and emits a yellow light, so that a blue light unabsorbed by the phosphor is mixed with the yellow light, resulting in emission of the white light.

As known in the art, the above phosphor typically includes a host material composed of an yttrium and aluminum composite oxide ($Y_3Al_5O_{12}$), and cerium (Ce) incorporated as a luminescent center ion therein. The phosphor is not necessarily easily produced owing to its high calcination temperature, etc. In addition, the phosphor tends to be deteriorated in brightness with the increase in temperature upon use. Therefore, when the phosphor is applied to displays or lighting systems, the brightness thereof tends to be lowered with the temperature rise of these apparatuses, resulting in problems such as low color rendering property of the light emitting device. Further, in the case of white LED as a typical light emitting device which is constituted by the combination of a blue LED and a yellow phosphor, the amount of light emitted therefrom in red range (not less than 600 nm) and bluish green range (480 to 510 nm) is small, and the light emitted from the white LED has a low general color rendering index Ra as well as a low special color rendering index $R_5$ that represents a color rendering property in the bluish green range.

On the other hand, in "Optical Materials", 6 (1996), pp. 153–159, there is described a light emitting substance composed of Cr-activated $Ca_3Sc_2Ge_3O_{12}$. However, the use of such a light emitting substance is industrially disadvantageous since a Ge compound as a raw material thereof is very expensive.

The present invention has been made in view of the above problems. An object of the present invention is to provide a phosphor capable of not only being readily produced but also providing a light emitting device having a high color rendering property, a light emitting device using the phosphor, and a display and a lighting system using the light emitting device as a light source thereof.

DISCLOSURE OF THE INVENTION

As a result of the present inventors' earnest studies, it has been found that the above object can be achieved by the phosphor including a host material composed of a compound having a specific garnet crystal structure containing Si as a constituent element thereof, and a luminescent center ion incorporated in the host material. The present invention has been attained on the basis of the above finding.

That is, in a first aspect of the present invention, there is provided a phosphor comprising a host material composed of a compound having a garnet crystal structure represented by the general formula (I):

$$M^1{}_aM^2{}_bM^3{}_cO_d \qquad (I)$$

wherein $M^1$ is a divalent metal element; $M^2$ is a trivalent metal element; $M^3$ is a tetravalent metal element containing at least Si; and a is the number of 2.7 to 3.3, b is the number of 1.8 to 2.2, c is the number of 2.7 to 3.3, and d is the number of 11.0 to 13.0; and a luminescent center ion incorporated in said host material.

In a second aspect of the present invention, there is provided a light emitting device comprising the above phosphor and a semiconductor light emitting element capable of emitting a light in the range of from ultraviolet light to visible light.

In a third aspect of the present invention, there is provided a display using the above light emitting device as a light source.

In a fourth aspect of the present invention, there is provided a lighting system using the above light emitting device as a light source.

PREFERRED EMBODIMENT OF THE PRESENT INVENTION

Figure 1:
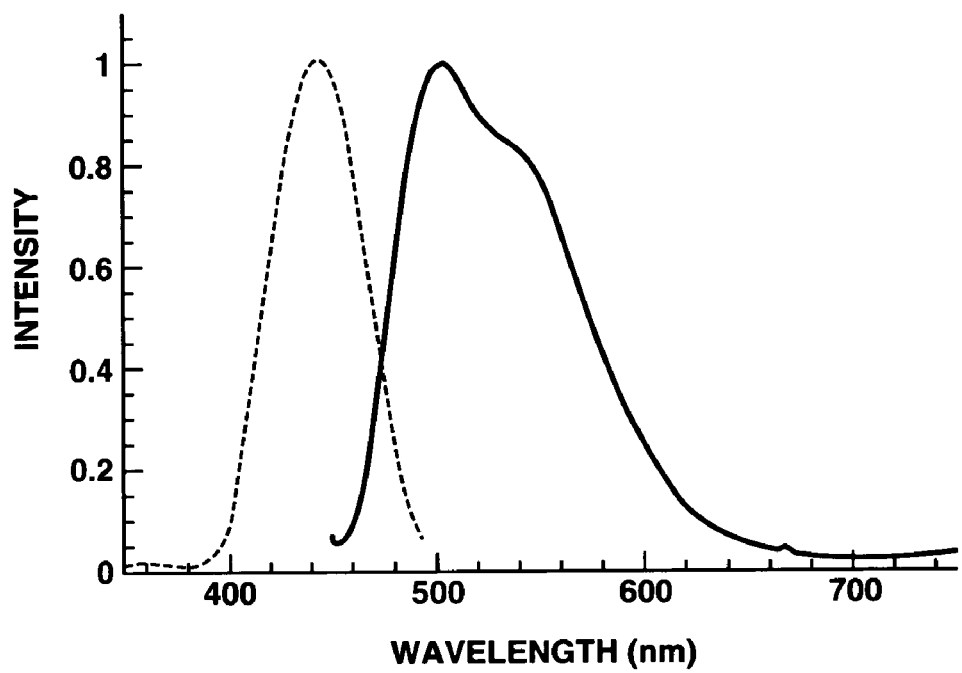
FIG. 1 is a graph showing an emission spectrum and an excitation spectrum of a phosphor obtained in Example 1 according to the present invention, in which the solid line represents the emission spectrum, and the broken line represents the excitation spectrum.

The phosphor of the present invention contains a host material composed of a compound having a garnet crystal structure represented by the above general formula (I). Specifically, the phosphor of the present invention is generally in the form of a composite oxide containing metal elements $M^1$, $M^2$ and $M^3$, and contains a host material composed of a compound having a known garnet crystal structure of $M^1{}_3M^2{}_2M^3{}_3O_{12}$, wherein $M^1$ is a divalent metal element, $M^2$ is a trivalent metal element, and $M^3$ is a tetravalent metal element containing at least Si.

The divalent metal element $M^1$ in the formula (I) is usually at least one element selected from the group consisting of Mg, Ca, Zn, Sr, Cd and Ba from the viewpoint of good light emitting efficiency, preferably Mg, Ca or Zn, and more preferably Ca. In this case, Ca may be used singly or in the form of a composite of Ca and Mg. Although $M^1$ is preferably composed basically of at least one of the above-described elements, $M^1$ may also contain other divalent metal element as long as the phosphor obtained by partially substituting the above-described metal element with the other divalent metal element can still retain not less than 70% of the light efficiency of the non-substituted phosphor. Meanwhile, in such a case, the content of the other divalent metal element in the substituted phosphor is usually not more than 10 mol %, preferably not more than 5 mol %, more preferably not more than 1 mol % based on $M^1$.

The trivalent metal element $M^2$ in the formula (I) is usually at least one element selected from the group consisting of Al, Sc, Ga, Y, In, La, Gd and Lu from the viewpoint of good light emitting efficiency, preferably Al, Sc, Y or Lu, and more preferably Sc. In this case, Sc may be used singly or in the form of a composite with Y or Lu. Although $M^2$ is preferably composed basically of at least one of the above-described elements, $M^2$ may also contain other trivalent metal element as long as the phosphor obtained by partially substituting the above-described metal element with the other trivalent metal element can still retain not less than 70% of the light efficiency of the non-substituted phosphor. Meanwhile, the content of the other trivalent metal element in the substituted phosphor is usually not more than 10 mol %, preferably not more than 5 mol %, more preferably not more than 1 mol % based on $M^2$.

The $M^3$ in the formula (I) represents a tetravalent metal element containing at least Si. The content of Si in the $M^3$ is usually not less than 50 mol %, preferably not less than 70 mol %, more preferably not less than 80 mol %, most preferably not less than 90 mol %. The tetravalent metal element $M^3$ other than Si is usually at least one element selected from the group consisting of Ti, Ge, Zr, Sn and Hf from the viewpoint of good light emitting efficiency, preferably at least one element selected from the group consisting of Ti, Zr, Sn and Hf, and more preferably Sn. Still more preferably, the $M^3$ is substantially composed of Si. Although $M^3$ is preferably composed basically of at least one of the above-described elements, $M^3$ may also contain other tetravalent metal element as long as the phosphor obtained by partially substituting the above-described metal element with the other tetravalent metal element can still retain not less than 70% of the light efficiency of the non-substituted phosphor. Meanwhile, in such a case, the content of the other tetravalent metal element in the substituted phosphor is usually not more than 10 mol %, preferably not more than 5 mol %, more preferably not more than 1 mol % based on $M^3$.

Also, as described above, the garnet crystal structure is generally a crystal structure with a body centered cubic lattice which is represented by the formula (I) wherein a is 3, b is 2, c is 3 and d is 12. However, in the present invention, any of the metal elements $M^1$, $M^2$ and $M^3$ may be replaced at the crystal lattice with an element constituting the luminescent center ion as described later, or the luminescent center ion element may be incorporated in an interstitial space between the crystal lattices. As a result, in the formula (I), a is in the range of 2.7 to 3.3, preferably 2.9 to 3.1, b is in the range of 1.8 to 2.2, preferably 1.95 to 2.05, c is in the range of 2.7 to 3.3, preferably 2.9 to 3.1, and d is in the range of 11.0 to 13.0, preferably 11.65 to 12.35.

The luminescent center ion incorporated in the compound having a garnet crystal structure as the host material is usually at least one di- to tetra-valent element selected from the group consisting of Cr, Mn, Fe, Co, Ni, Cu, Ce, Pr, Nd, Sm, Eu, Tb, Dy, Ho, Er, Tm and Yb, preferably at least one element selected from the group consisting of Mn, Fe, Co, Ni, Cu, Ce, Sm, Eu, Tb, Dy and Yb, more preferably divalent Mn, trivalent Ce, di- or tri-valent Eu or trivalent Tb, and still more preferably trivalent Ce.

In particular, by containing Ce as the luminescent center ion in the host material thereof, the phosphor composed of the host material containing Ce of the present invention tends to show a high emission intensity as well as a small temperature quenching and, therefore, a less change in emission intensity with temperature change. Accordingly, the phosphor of the present invention can be effectively prevented from suffering from deterioration in brightness thereof with temperature rise of apparatuses when applied to displays or lighting systems.

The phosphor of the present invention can be produced by subjecting a mixture prepared by pulverizing a divalent metal element $M^1$-source compound, a trivalent metal element $M^2$-source compound, a tetravalent metal element $M^3$-source compound and a luminescent center ion-source compound, to heat-calcination treatment.

The pulverized mixture may be prepared by the following dry or wet method.

(1) In the dry method, after pulverizing the above compounds using a dry pulverizer such as hammer mill, roll mill, ball mill and jet mill, the resultant pulverized compounds may be mixed together using a mixer such as ribbon blender, V-type blender and Henschel mixer. Alternatively, after mixing the above compounds with each other, the resultant mixture may be pulverized using the dry pulverizer.

(2) In the wet method, after adding the above compounds to a medium such as water, the resultant mixture may be pulverized and mixed together using a wet pulverizer such as a medium-agitation type pulverizer. Alternatively, after pulverizing the above compounds using the dry pulverizer, the resultant pulverized compounds may be added in a medium such as water and then mixed together to prepare a slurry, and further the obtained slurry may be spray-dried.

Among these pulverizing and mixing methods, the wet method is preferably used because it is required to uniformly mix and disperse a small amount of the luminescent center ion-source compound in the whole mixture. The wet method is also preferred from the viewpoint of obtaining such a mixture, in which the other element-source compounds are uniformly mixed and dispersed.

The above heat-calcination treatment may be conducted at a temperature of usually 1,000 to 1,600° C., preferably 1,200 to 1,500° C. for 10 minutes to 24 hours in a heat-resistant container composed of alumina or quartz such as crucible or tray. The heating atmosphere may be appropriately selected from atmospheric air, oxygen, carbon monoxide, carbon dioxide, nitrogen, hydrogen, argon or the like. These gaseous atmospheres may be used singly or in the form of a mixture thereof. Meanwhile, after the heat-calcination treatment, the obtained product may be further subjected to various treatments such as washing, drying and classification, if required.

The heating atmosphere may be such an atmosphere required to obtain the ionic condition (ionic valence) contributing to light emission of the luminescent center ion element. For example, an oxidative or neutral atmosphere such as atmospheric air, oxygen, nitrogen and argon may be used in order to obtain trivalent Eu, etc., a weak-oxidative or weak-reducing atmosphere such as atmospheric air, carbon monoxide, carbon dioxide and nitrogen may be used in order to obtain trivalent Ce, etc., and a neutral or reducing atmosphere such as carbon monoxide, nitrogen, hydrogen and argon may be used in order to obtain divalent Mn, divalent Eu, trivalent Tb, etc.

In addition, the $M^1$-source compound, $M^2$-source compound, $M^3$-source compound and luminescent center ion element-source compound may be in the form of oxides, hydroxides, carbonates, nitrates, sulfates, oxalates, carboxylates, halides or the like of the respective elements. The respective element-source compounds may be selected from these compounds in consideration of reactivity for producing the composite oxide as well as no formation of NOx, SOx, etc., upon the calcination, or the like.

When the divalent metal element $M^1$ is selected from Mg, Ca and Zn, specific examples of the $M^1$-source compound are as follows.

That is, specific examples of the Mg-source compound may include MgO, $Mg(OH)_2$, $MgCO_3$, $Mg(OH)_2 \cdot 3MgCO_3 \cdot 3H_2O$, $Mg(NO_3)_2 \cdot 6H_2O$, $MgSO_4$, $Mg(OCO)_2 \cdot 2H_2O$, $Mg(OCOCH_3)_2 \cdot 4H_2O$, $MgCl_2$ or the like. Specific examples of the Ca-source compound may include CaO, $Ca(OH)_2$, $CaCO_3$, $Ca(NO_3)_2 \cdot 4H_2O$, $CaSO_4 \cdot 2H_2O$, $Ca(OCO)_2 \cdot H_2O$, $Ca(OCOCH_3)_2 \cdot H_2O$, $CaCl_2$ or the like. Specific examples of the Zn-source compound may include ZnO, $Zn(OH)_2$, $ZnCO_3$, $Zn(NO_3)_2$, $Zn(OCO)_2$, $Zn(OCOCH_3)_2$, $ZnCl_2$ or the like.

When the trivalent metal element $M^2$ is selected from Al, Sc, Y and Lu, specific examples of the $M^2$-source compound are as follows.

That is, specific examples of the Al-source compound may include $Al_2O_3$, $Al(OH)_3$, AlOOH, $Al(NO_3)_3 \cdot 9H_2O$, $Al_2(SO_4)_3$, $AlCl_3$ or the like. Specific examples of the Sc-source compound may include $Sc_2O_3$, $Sc(OH)_3$, $Sc_2(CO_3)_3$, $Sc(NO_3)_3$, $Sc_2(SO_4)_3$, $Sc_2(OCO)_6$, $Sc(OCOCH_3)_3$, $ScCl_3$ or the like. Specific examples of the Y-source compound may include $Y_2O_3$, $Y(OH)_3$, $Y_2(CO_3)_3$, $Y(NO_3)_3$, $Y_2(SO_4)_3$, $Y_2(OCO)_6$, $YCl_3$ or the like. Specific examples of the Lu-source compound may include $Lu_2O_3$, $Lu_2(SO_4)_3$, $LuCl_3$ or the like.

When the tetravalent metal element $M^3$ is selected from Si, Ge and Sn, specific examples of the $M^3$-source compound are as follows.

That is, specific examples of the Si-source compound may include $SiO_2$, $H_4SiO_4$, $Si(OC_2H_5)_4$, $CH_3Si(OCH_3)_3$, $CH_3Si(OC_2H_5)_3$, $Si(OCOCH_3)_4$ or the like. Specific examples of the Ge-source compound may include $GeO_2$, $Ge(OH)_4$, $Ge(OCOCH_3)_4$, $GeCl_4$ or the like. Specific examples of the Sn-source compound may include $SnO_2 SnO_2 \cdot nH_2O$, $Sn(NO_3)_4$, $Sn(OCOCH_3)_4$, $SnCl_4$ or the like.

When the luminescent center ion element is selected from Mn, Ce, Eu and Tb, specific examples of the luminescent center ion element-source compound are as follows.

That is, specific examples of the Mn-source compound may include $MnO_2$, $Mn_2O_3$, $Mn_3O_4$, MnOOH, $MnCO_3$, $Mn(NO_3)_2$, $MnSO_4$, $Mn(OCOCH_3)_2$, $Mn(OCOCH_3)_3$, $MnCl_2$, $MnCl_3$ or the like. Specific examples of the Ce-source compound may include $Ce_2O_3$, $CeO_2$, $Ce(OH)_3$, $Ce(OH)_4$, $Ce_2(CO_3)_3$, $Ce(NO_3)_3$, $Ce_2(SO_4)_3$, $Ce(SO_4)_2$, $Ce_2(OCO)_6$, $Ce(OCOCH_3)_3$, $CeCl_3$, $CeCl_4$ or the like. Specific examples of the Eu-source compound may include $Eu_2O_3$, $Eu_2(SO_4)_3$, $Eu_2(OCO)_6$, $EuCl_2$, $EuCl_3$ or the like. Specific examples of the Tb-source compound may include $Tb_2O_3$, $Tb_4O_7$, $Tb_2(CO_3)_3$, $Tb_2(SO_4)_3$, $TbCl_3$ or the like.

The phosphor of the present invention contains the luminescent center ion in an amount of usually 0.0001 to 0.3 mol based on a formula weight of the compound as the host material thereof. The lower limit of the content of the luminescent center ion is preferably 0.001 mol, and the upper limit thereof is preferably 0.15 mol. When the content of the luminescent center ion is less than the above-specified range, the emission intensity of the resultant phosphor tends to be lowered. On the other hand, when the content of the luminescent center ion is more than the above-specified range, the emission intensity of the resultant phosphor also tends to be reduced owing to such a phenomenon called "concentration quenching".

In the case where the phosphor of the present invention is used as a wavelength conversion material, the phosphor, for example, containing trivalent Ce as the luminescent center ion, absorbs a light in the range of from ultraviolet light to blue-region visible light, and emits a visible light having a longer wavelength than that of the absorbed light, such as green light, yellow light, orange light, red light or a light exhibiting an intermediate color thereof. When only the light emitted from the phosphor except for a scattered component of excitation light therefor is measured by spectroscopic method to represent the color of the emitted light by XYZ color system according to JIS Z8701, a sum of color coordinates x and y is preferably not less than 0.6 (($x+y$)$\geq$ 0.6), more preferably not less than 0.8 (($x+y$)$\geq$0.8). Meanwhile, the upper limit of the sum of the color coordinates x and y is 1.

The phosphor of the present invention has a brightness keeping percentage of usually not less than 90%, preferably not less than 92%. The brightness keeping percentage of the phosphor may be measured by the following method.

First, about 100 mg of sample particles (phosphor) to be measured are filled in a 8 mm-diameter holder for particles, and the holder is set on a temperature characteristic evaluation apparatus manufactured by Koyo Denshi Co., Ltd. Thereafter, while keeping the sample at 25° C. and 100° C., a 460 nm excitation light (obtained by separating a light irradiated from a 150 W xenon lamp using a grating monochromator) is irradiated thereon in atmospheric air to measure a brightness thereof using a luminance calorimeter "BM5A" manufactured by TOPCON Inc. The ratio of the brightness measured at 100° C. to that measured at 25° C. is calculated to obtain a brightness keeping percentage (%) of the phosphor.

The light emitting device of the present invention includes the above phosphor as a wavelength conversion material, and a semiconductor light emitting element such as LED and LD. The light emitting device is a high-color-rendering light emitting device capable of absorbing a light in the range of from ultraviolet light to a visible light, which is emitted from the semiconductor light emitting element, and emitting a visible light having a longer wavelength than that of the absorbed light. The light emitting device may be suitably used as a light source for displays such as color liquid crystal displays, or lighting systems such as surface-emitting type lighting systems.

Meanwhile, as the phosphor constituting the light emitting device of the present invention, the phosphor of the present invention may be used singly, or may be used in combination with the other phosphor. Namely, the light emitting device of the present invention may contain two or more kinds of phosphors.

The other phosphor usable in combination with the phosphor of the present invention is not particularly restricted as long as the phosphor is capable of absorbing a light in the range of from ultraviolet light to visible light, which is emitted from the semiconductor light emitting element, and emitting a visible light having a longer wavelength than that of the absorbed light. Examples of the other phosphor may include blue, green, yellow or red phosphor, etc. Among them, in order to obtain the light emitting device having a higher color rendering property, phosphors capable of emitting a light having a wavelength of 580 to 780 nm are preferably used. Specific examples of such phosphors are as follows.

Examples of the preferred phosphors containing divalent Eu as the luminescent center ion may include sulfide-based phosphors such as $CaS:Eu^{2+}$ and $SrS:Eu^{2+}$, nitride-based phosphors such as $Ca_2Si_5N_8:Eu^{2+}$, $Sr_2Si_5N_8:Eu^{2+}$ and $Ba_2Si_5N_8$oxy-nitride-based phosphors such as $Ca(Si, Al)_{12}(o, N)_{16}:Eu^{2+}$, or the like. Examples of the preferred phosphors containing trivalent Eu as the luminescent center ion may include oxy-sulfide-based phosphors such as $La_2O_2S:Eu^{3+}$ and $Y_2O_2S:Eu^{3+}$, coordination compound-based phosphors having such a structure that acetylacetone, thenoyltrifluoroacetone, etc., is coordinated to the trivalent Eu, or the like. Examples of the preferred phosphors containing tetravalent Mn as the luminescent center ion may include $3.5MgO \cdot 0.5MgF_2 \cdot GeO_2:Mn^{4+}$ or the like. Among these phosphors, the sulfide-based and nitride-based phosphors containing $Eu^{2+}$ as the luminescent center ion are preferred because of a high emission intensity thereof.

The semiconductor light emitting element constituting the light emitting device of the present invention is not particularly restricted as long as the element is capable of emitting a light in the range of from ultraviolet light to a visible light. Among these elements, those semiconductor light emitting elements capable of emitting a light having a wavelength of 380 to 550 nm. The lower limit of the wavelength range of the light emitted from the semiconductor light emitting elements is preferably 400 nm, more preferably 420 nm, and the upper limit thereof is preferably 520 nm, more preferably 500 nm.

In addition, when the phosphor of the present invention is used in combination with the other phosphor, and the semiconductor light emitting element capable of emitting a light having the above-specified wavelength range, especially a wavelength of 430 to 480 nm, is used as the semiconductor light emitting element constituting the light emitting device of the present invention, it is possible to obtain a while light emitting device having a still higher color rendering property. The thus obtained light emitting device can emit a light having a general color rendering index Ra of usually not less than 80, and a special color rendering index $R_5$ of usually not less than 90 which represents a color rendering property in the bluish green range. Higher indices Ra and $R_5$ are preferable. In particular, the index Ra is more preferably not less than 85. The upper limit of each of the indices Ra and $R_5$ is 100. In this case, as the other phosphor, there are preferably used the above-described phosphors capable of emitting a light having a wavelength of 580 to 780 nm.

Next, the light emitting device of the present invention is explained by referring to the accompanying drawings.

Figure 3:
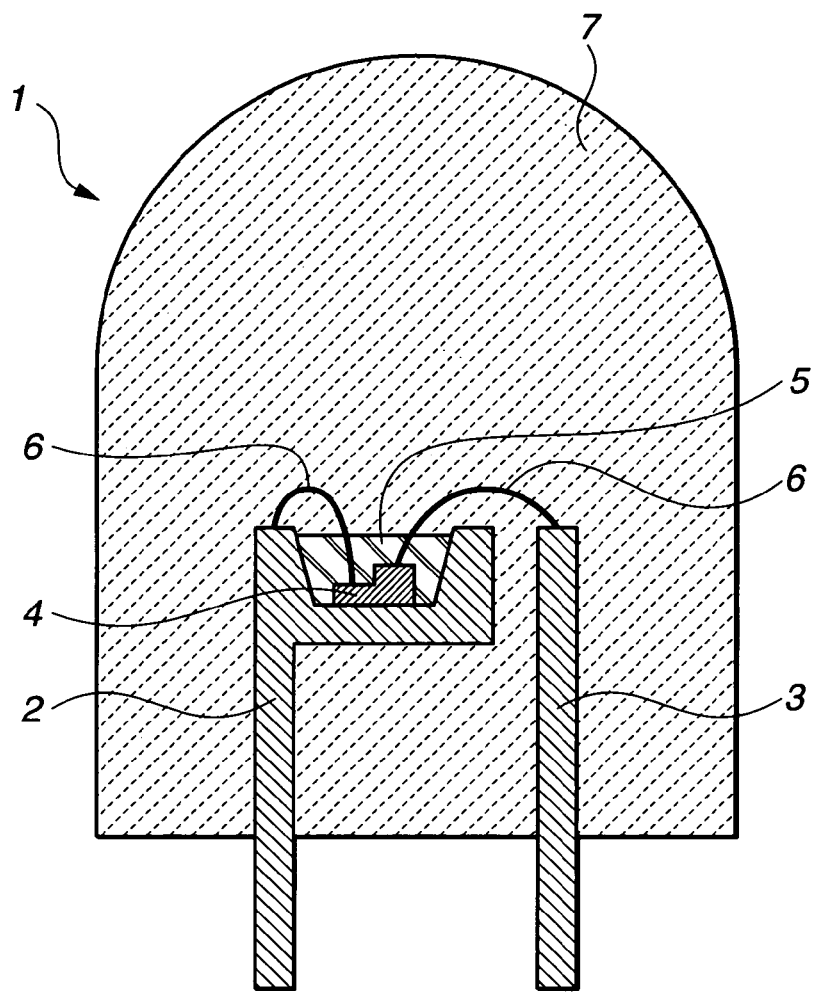
FIG. 3 is a schematic sectional view showing an example of a light emitting device constituted from the phosphor of the present invention as a wavelength conversion material, and a semiconductor light emitting element.

As shown in FIG. 3, the light emitting device 1 of the present invention has a generally shell-like shape. A semiconductor light emitting element 4 composed of a GaN-based blue light emitting diode, etc., is disposed within an upper cup portion of a mount lead 2, and an upper surface of the light emitting element 4 is covered with a phosphor-containing resin 5 which is formed by pouring a mixture prepared by mixing and dispersing the phosphor of the present invention with a binder such as epoxy resin and acrylic resin, into the upper cup portion. The semiconductor light emitting element 4 and the mount lead 2, and the semiconductor light emitting element 4 and an inner lead 3, are respectively electrically connected with each other by conductive wires 6, 6. These elements are wholly covered and protected by a molding material 7 composed of epoxy resin, etc.

Figure 4:
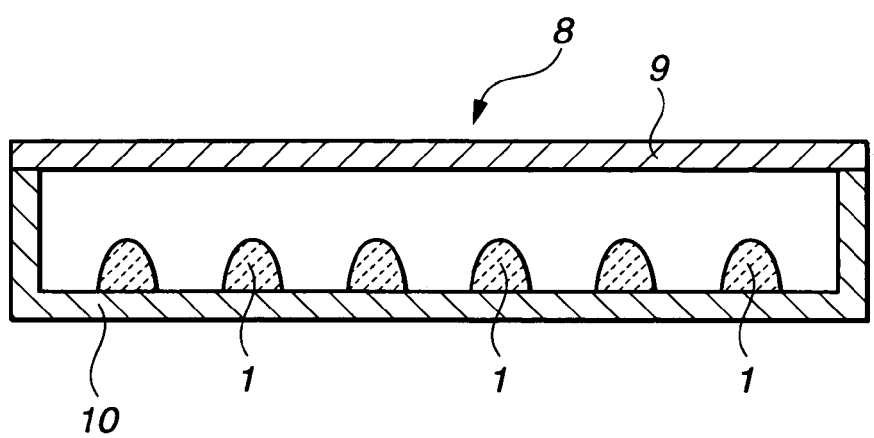
FIG. 4 is a schematic sectional view showing an example of a surface-emitting lighting system into which the light emitting devices shown in FIG. 3 are incorporated.

In addition, as shown in FIG. 4, the surface-emitting lighting system 8 into which a plurality of the light emitting devices 1 are incorporated, includes a rectangular retaining casing 10 having a light-impermeable inside surface such as a white smooth surface, a number of the light emitting devices 1 arranged on a bottom surface of the casing 10, and a diffusion plate 9 such as an opaque white acrylic resin plate which is fixed to a position corresponding to a lid for the casing 10 to equalize a light emitted from the light emitting devices. Meanwhile, although power sources, circuits, etc., for operating the light emitting devices 1 are arranged outside the respective light emitting devices, these members are omitted from the figures for simplicity.

When a voltage is applied to the semiconductor light emitting element 4 of the respective light emitting devices 1 by operating the surface-emitting lighting system 8, a part of a light emitted therefrom such as blue light is absorbed by the phosphor of the present invention contained as a wavelength conversion material in the phosphor-containing resin portion 5, so that a light having a longer wavelength is emitted from the phosphor. The light emitted from the phosphor is mixed with a light unabsorbed by the phosphor such as blue light to obtain a mixed light having a higher color rendering property. The thus obtained light is transmitted through the diffusion plate 9 and then irradiated in the upward direction when viewed in FIG. 4. At this time, the light is equalized within the diffusion plate 9 of the retaining casing 10, so that a light having a uniform luminous intensity can be emitted from the lighting system.

The present invention is described in more detail by Examples, but the Examples are only illustrative and not intended to limit the scope of the present invention.

EXAMPLE 1

0.0297 mol of $CaCO_3$ as a $M^1$-source compound, 0.01 mol of $Sc_2O_3$ as a $M^2$-source compound, 0.03 mol of $SiO_2$ as a $M^3$-source compound and 0.0003 mol of $Ce(OCOCH_3)_3$ as a luminescent center ion element-source compound were pulverized and mixed together with pure water in a wet ball mill including an alumina container and beads, dried and then passed through a nylon mesh. The resultant pulverized mixture was heat-calcined in an alumina crucible under atmospheric air at 1,400° C. for 2 hours, and successively subjected to water-washing, drying and classification, thereby producing a phosphor.

As a result of analyzing the thus obtained phosphor by powder X-ray diffraction method, it was confirmed that the phosphor contained a host material composed of a compound of a garnet crystal structure having a composition as shown in Table 1, and trivalent Ce as a luminescent center ion incorporated in the host material. Further, the phosphor was subjected to measurements of emission spectrum and excitation spectrum thereof. The results are shown in FIG. 1. From the thus measured emission spectrum, the color coordinates x and y in XYZ color system prescribed in JIS Z8722 were calculated assuming that the wavelength interval was 5 nm. As a result, x was 0.28 (x=0.28), y was 0.54 (y=0.54), and a sum of x and y was 0.82 ((x+y)=0.82). Also, as a result of the brightness keeping percentage measurement, it was confirmed that the brightness keeping percentage was 95%. Further, the phosphor was irradiated with a blue light emitted from a GaN-based blue light emitting diode (peak wavelength: 465 nm), while controlling an irradiation intensity thereof. As a result, the phosphor absorbed the blue light and emitted a yellowish green color light, and further the emitted yellowish green light was then mixed with a blue light unabsorbed by the phosphor, resulting in emission of a bluish white light.

EXAMPLE 2

Figure 2:
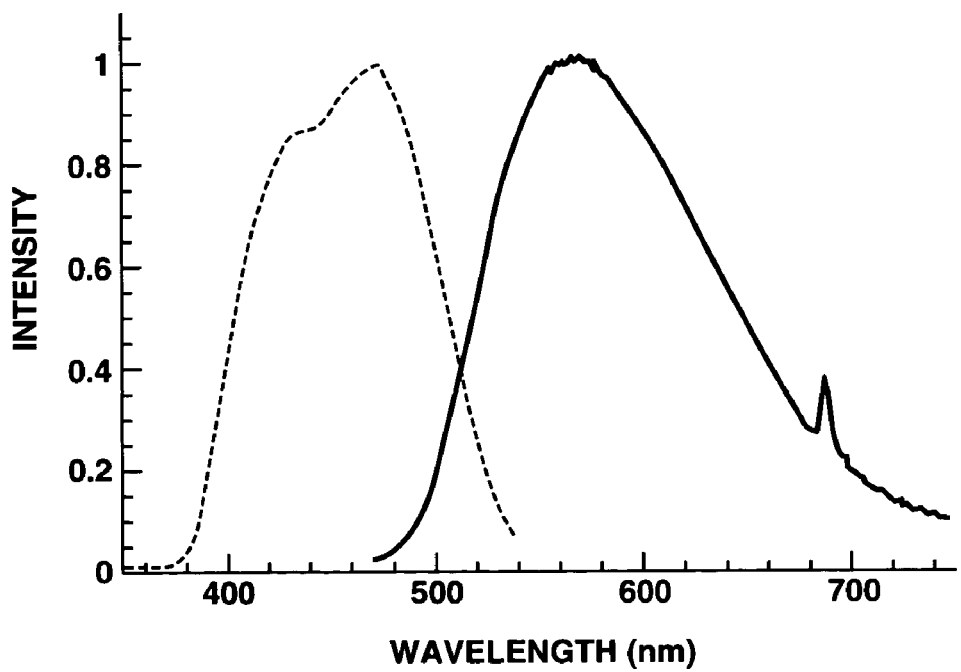
FIG. 2 is a graph showing an emission spectrum and an excitation spectrum of a phosphor obtained in Example 2 according to the present invention, in which the solid line represents the emission spectrum, and the broken line represents the excitation spectrum.

The same procedure as defined in Example 1 was conducted except that 0.0147 mol of $CaCO_3$ and 0.015 mol (as Mg) of $Mg(OH)_2.3MgCO_3.0.3H_2O$ were used as a $M^1$-source compound, and 0.0075 mol of $Sc_2O_3$ and 0.0025 mol of $Y_2O_3$ were used as a $M^2$-source compound, thereby producing a phosphor. As a result of analyzing the thus obtained phosphor by powder X-ray diffraction method, it was confirmed that the phosphor contained a host material composed of a compound of a garnet crystal structure having a composition as shown in Table 1, and trivalent Ce incorporated as a luminescent center ion in the host material. Further, the phosphor was subjected to measurements of emission spectrum and excitation spectrum thereof. The results are shown in FIG. 2. From the thus measured emission spectrum, the color coordinates x and y were calculated by the same method as in Example 1. As a result, it was confirmed that x was 0.43 (x=0.43), y was 0.53 (y=0.53), and a sum of x and y was 0.96 ((x+y)=0.96). Further, the phosphor was irradiated with a blue light by the same method as in Example 1, while controlling an irradiation intensity thereof. As a result, the phosphor absorbed the blue light and emitted a yellow color light, and further the emitted yellow light was then mixed with a blue light unabsorbed by the phosphor, resulting in emission of a white light.

EXAMPLE 3

The same procedure as defined in Example 1 was conducted except that the heat-treating temperature was changed to 1,200° C., thereby producing a phosphor. As a result of analyzing the thus obtained phosphor by powder X-ray diffraction method, it was confirmed that the phosphor contained a host material composed of a compound of a garnet crystal structure having a composition as shown in Table 1, and trivalent Ce incorporated as a luminescent center ion in the host material. From the measured emission spectrum of the phosphor, the color coordinates x and y were calculated by the same method as in Example 1. As a result, it was confirmed that x was 0.28 (x=0.28), y was 0.54 (y=0.54), and a sum of x and y was 0.82 ((x+y)=0.82). Further, the phosphor was irradiated with a blue light by the same method as in Example 1, while controlling an irradiation intensity thereof. As a result, the phosphor absorbed the blue light and emitted a yellowish green color light, and further the emitted yellowish green light was then mixed with a blue light unabsorbed by the phosphor, resulting in emission of a bluish white light.

EXAMPLE 4

The same procedure as defined in Example 2 was conducted except that 0.0050 mol of $Sc_2O_3$ and 0.0050 mol of $Y_2O_3$ were used as a $M^2$-source compound, thereby producing a phosphor. As a result of analyzing the thus obtained phosphor by powder X-ray diffraction method, it was confirmed that the phosphor contained a host material composed of a compound of a garnet crystal structure having a composition as shown in Table 1, and trivalent Ce incorporated as a luminescent center ion in the host material. From the measured emission spectrum of the phosphor, the color coordinates x and y were calculated by the same method as in Example 1. As a result, it was confirmed that x was 0.47 (x=0.47), y was 0.50 (y=0.50), and a sum of x and y was 0.97 ((x+y)=0.97). Further, the phosphor was irradiated with a blue light by the same method as in Example 1, while controlling an irradiation intensity thereof. As a result, the phosphor absorbed the blue light and emitted a yellow color light, and further the emitted yellow light was then mixed with a blue light unabsorbed by the phosphor, resulting in emission of a white light.

EXAMPLE 5

The same procedure as defined in Example 2 was conducted except that 0.0050 mol of $Sc_2O_3$ and 0.0050 mol of $Lu_2O_3$ were used as a $M^2$-source compound, thereby producing a phosphor. As a result of analyzing the thus obtained phosphor by powder X-ray diffraction method, it was confirmed that the phosphor contained a host material composed of a compound of a garnet crystal structure having a composition as shown in Table 1, and trivalent Ce incorporated as a luminescent center ion in the host material. From the measured emission spectrum of the phosphor, the color coordinates x and y were calculated by the same method as in Example 1. As a result, it was confirmed that x was 0.45 (x=0.45), y was 0.53 (y=0.53), and a sum of x and y was 0.98 ((x+y)=0.98). Further, the phosphor was irradiated with a blue light by the same method as in Example 1, while controlling an irradiation intensity thereof. As a result, the phosphor absorbed the blue light and emitted a yellow color light, and further the emitted yellow light was then mixed with a blue light unabsorbed by the phosphor, resulting in emission of a white light.

EXAMPLE 6

The same procedure as defined in Example 1 was conducted except that 0.0147 mol of $CaCO_3$ and 0.015 mol of ZnO were used as an $M^1$-source compound, thereby producing a phosphor. As a result of analyzing the thus obtained phosphor by powder X-ray diffraction method, it was confirmed that the phosphor contained a host material composed of a compound of a garnet crystal structure having a composition as shown in Table 1, and trivalent Ce incorporated as a luminescent center ion in the host material. From the measured emission spectrum of the phosphor, the color coordinates x and y were calculated by the same method as in Example 1. As a result, it was confirmed that x was 0.29 (x=0.29), y was 0.54 (y=0.54), and a sum of x and y was 0.83 ((x+y)=0.83). Further, the phosphor was irradiated with a blue light by the same method as in Example 1, while controlling an irradiation intensity thereof. As a result, the phosphor absorbed the blue light and emitted a yellowish green color light, and further the emitted yellowish green light was then mixed with a blue light unabsorbed by the phosphor, resulting in emission of a bluish white light.

TABLE 1

| Examples | Composition of phosphor |
|---|---|
| Example 1 | $(Ca_{0.99})_3Sc_2Si_3O_{12.015}{:}Ce^{+3}$ |
| Example 2 | $(Ca_{0.49}Mg_{0.50})_3(Sc_{0.75}Y_{0.25})_2Si_3O_{12.015}{:}Ce^{+3}$ |
| Example 3 | $(Ca_{0.99})_3Sc_2Si_3O_{12.015}{:}Ce^{+3}$ |
| Example 4 | $(Ca_{0.49}Mg_{0.50})_3(Sc_{0.50}Y_{0.50})_2Si_3O_{12.015}{:}Ce^{+3}$ |
| Example 5 | $(Ca_{0.49}Mg_{0.50})_3(Sc_{0.50}Lu_{0.50})_2Si_3O_{12.015}{:}Ce^{+3}$ |
| Example 6 | $(Ca_{0.49}Zn_{0.50})_3Sc_2Si_3O_{12.015}{:}Ce^{+3}$ |

The phosphors obtained in Examples 2 to 6 exhibited a high emission intensity and a low temperature quenching, and, therefore, showed a less change in emission intensity with temperature change as well as a high brightness keeping percentage.

COMPARATIVE EXAMPLE 1

1.05 mol of $Y_2O_3$, 0.39 mol of $Gd_2O_3$, 2.5 mol of $Al_2O_3$, 0.12 mol of $CeO_2$ and 0.25 mol of $BaF_2$ as a flux were pulverized and mixed together with pure water in a wet ball mill including an alumina container and beads, dried and then passed through a nylon mesh. The resultant pulverized mixture was heat-calcined in an alumina crucible under atmospheric air at 1,450° C. for 2 hours, and successively subjected to water-washing, drying and classification, thereby producing a phosphor having a composition of $(Y_{0.7}Gd_{0.26}Ce_{0.04})_3Al_5O_{12}$.

From the measured emission spectrum of the phosphor, the color coordinates x and y were calculated by the same method as in Example 1. As a result, it was confirmed that x was 0.45 (x=0.45), y was 0.53 (y=0.53), and a sum of x and y was 0.98 ((x+y)=0.98). Also, as a result of the brightness measurement, it was confirmed that the brightness keeping percentage was 88%. Therefore, it was suggested that when a light emitting device using such a phosphor was applied to displays or lighting systems, the brightness thereof would be deteriorated with temperature rise of these apparatuses.

Further, the phosphor was irradiated with a blue light by the same method as in Example 1, while controlling an irradiation intensity thereof. As a result, the phosphor absorbed the blue light and emitted a yellow color light, and further the emitted yellow light was then mixed with a blue light unabsorbed by the phosphor, resulting in emission of a white light.

EXAMPLE 7

The phosphor obtained in Example 1 and a red phosphor composed of (Zn, Cd)S:Ag (phosphor for vacuum fluorescent displays "LDP-R2" produced by Kasei Optonix, Ltd.) were used to produce a shell-shaped white LED by the following procedure.

First, a LED emitting a light at a wavelength of 460 nm ("C460-MB290-E1000" produced by Cree Inc.) was bonded to a cup portion of a frame for shell-shaped LED through a conductive mounting material composed of silver paste. Then, an electrode of the LED was connected to a terminal of the frame through an Au wire.

The red phosphor composed of (Zn, Cd)S:Ag and the phosphor obtained in Example 1 were mixed together at a weight ratio of 4:96. 1 g of the resultant phosphor mixture was intimately mixed with 1 g of an epoxy resin.

The thus obtained mixture composed of the phosphors and the resin (hereinafter referred to as "phosphor paste") was poured into the cup portion of the frame bonded to the LED, and allowed to stand at 120° C. for one hour to cure the epoxy resin.

Next, the frame thus fitted with the LED and the phosphors was inserted into a shell-shaped mold into which an epoxy resin has been filled, and allowed to stand at 120° C. for one hour to cure the resin. Thereafter, the resultant molded product was released from the mold, thereby producing a shell-shaped white LED.

The thus obtained shell-shaped white LED was subjected to measurement of emission spectrum thereof, and color rendering indices thereof were calculated from the measured spectrum.

Meanwhile, the white LED was operated at room temperature (about 24° C.) by applying a current of 20 mA thereto. A whole light emitted from the white LED was received by an integrating sphere, and further introduced into a monochromator through an optical fiber to measure an emission spectrum thereof. As the data of the measured emission spectrum, values of emission intensity were recorded in the range of 380 to 780 nm at intervals of 5 nm. On the basis of the thus obtained data, there were measured the color temperature, CIE color coordinate values x and y, general color rendering index Ra and special color rendering index $R_5$. The results are shown in Table 2. In addition, at this time, it was confirmed that a whole luminous flux was 2.1 lumen (1 m).

EXAMPLE 8

The same procedure as defined in Example 7 was conducted except that a complex having a composition of $Eu(TTA)_3(TPPO)_2$ was used as a red phosphor, and the weight ratio of the red phosphor to the phosphor obtained in Example 1 was changed to 90:10, thereby producing a shell-shaped white LED and evaluating emission characteristics thereof.

Meanwhile, the complex having a composition of $Eu(TTA)_3(TPPO)_2$ as the red phosphor was prepared by the following method. Here, TTA represents thenoyltrifluoroacetonate, TPPO represents triphenylphosphine oxide, and H-TTA as described later represents thenoyltrifluoroacetone.

First, there was prepared 0.5 liter of an ethanol mixed solution containing H-TTA, TPPO and NaOH in amounts of 0.3 mol/liter, 0.2 mol/liter and 0.3 mol/liter, respectively.

The obtained solution was heated to 60 to 70° C. and intimately stirred while being kept in the temperature range. Then, 100 ml of a 0.5 mol/liter europium chloride aqueous solution was dropped into the above solution for 30 minutes. The resultant precipitate was filtered out, washed with ethanol, and then dried under reduced pressure at 50° C. for 5 hours.

The obtained white LED was subjected to measurements of color temperature, CIE color coordinate values x and y, general color rendering index Ra and special color rendering index $R_5$ thereof by the same method as in Example 7. The results are shown in Table 2. In addition, at this time, it was confirmed that a whole luminous flux was 2.2 lumen (lm).

COMPARATIVE EXAMPLE 2

The same procedure as defined in Example 7 was conducted except that only 1 g of the phosphor obtained in Comparative Example 1 was used to prepare the phosphor paste, thereby producing a white LED.

The obtained white LED was subjected to measurements of color temperature, CIE color coordinate values x and y, general color rendering index Ra and special color rendering index $R_5$ thereof by the same method as in Example 7. The results are shown in Table 2. In addition, at this time, it was confirmed that a whole luminous flux was 1.9 lumen (lm).

TABLE 2

| Examples | Color temperature [K] | Color coordinate x | Color coordinate y | General color rendering index Ra | Special color rendering index $R_5$ |
|---|---|---|---|---|---|
| Example 7 | 5900 | 0.33 | 0.33 | 92.5 | 91.9 |
| Example 8 | 7400 | 0.29 | 0.34 | 88.2 | 92.7 |
| Comparative Example 2 | 6000 | 0.32 | 0.33 | 75.9 | 73.6 |

INDUSTRIAL APPLICABILITY

According to the present invention, there are provided a phosphor that is readily produced and can provide a high-color-rendering light emitting device, a light emitting device using the phosphor, and a display and a lighting system using the light emitting device as a light source.

The invention claimed is:

1. A phosphor comprising a host material composed of a compound having a garnet crystal structure represented by the general formula (I):

$$M^1{}_a M^2{}_b M^3{}_c O_d \quad (I)$$

wherein $M^1$ is a divalent metal element, $M^2$ is a trivalent metal element, $M^3$ is a tetravalent metal element containing at least Si, a is the number of 2.7 to 3.3, b is the number of 1.8 to 2.2, c is the number of 2.7 to 3.3, and d is the number of 11.0 to 13.0; and Ce as a luminescent center ion and in addition to Ce at least one element selected from the group consisting of Cr, Mn, Fe, Co, Ni, Pr, Nd, Sm, Eu, Tb, Dy, Ho, Er, Tm, and Yb are incorporated in said host material.

2. A phosphor according to claim 1, wherein the tetravalent metal element $M^3$ contains Si in an amount of not less than 50 mol%.

3. A phosphor according to claim 1, wherein the divalent metal element $M^1$ in the formula (I) is at least one element selected from the group consisting of Mg, Ca, Zn, Sr, Cd and Ba.

4. A phosphor according to claim 1, wherein the divalent metal element $M^1$ in the formula (I) is Mg, Ca or Zn.

5. A phosphor according to claim 1, wherein the trivalent metal element $M^2$ in the formula (I) is at least one element selected from the group consisting of Al, Sc, Ga, Y, In, La, Gd and Lu.

6. A phosphor according to claim 1, wherein the trivalent metal element $M^2$ in the formula (I) is Al, Sc, Y or Lu.

7. A phosphor according to claim 1, wherein the tetravalent metal element $M^3$ other than Si in the formula (I) is at least one element selected from the group consisting of Ti, Ge, Zr, Sn and Hf.

8. A phosphor according to claim 1, wherein the tetravalent metal element $M^3$ other than Si in the formula (I) is at least one element selected from the group consisting of Ti, Zr, Sn and Hf.

9. A phosphor according to claim 1, wherein the tetravalent metal element $M^3$ other than Si in the formula (I) is Ge or Sn.

10. A phosphor according to claim 1, wherein in addition to Ce as the luminescent center ion at least one element selected from the group consisting of Mn, Fe, Co, Ni, Cu, Pr, Sm, Eu, Tb, Dy, and Yb is contained as the luminescent center ion.

11. A phosphor according to claim 1, wherein the luminescent Ce center ion is trivalent Ce.

12. A phosphor according to claim 1, wherein in the formula (1), the divalent metal element $M^1$ is Ca, the trivalent metal element $M^2$ is Sc, and the tetravalent metal element $M^3$ is Si.

13. A phosphor according to claim 1, wherein in the formula (1), the divalent metal element $M^1$ is Ca and Mg, the trivalent metal element $M^2$ is Sc and Y, or Sc and Lu, and the tetravalent metal element $M^3$ is Si.

14. A phosphor according to claim 1, wherein the amount of the luminescent center ion is 0.0001 to 0.3 mol based on a formula weight of the host material compound.

15. A phosphor according to claim 1, wherein when a light emitted therefrom is represented by an XYZ color system and a sum of color coordinates x and y is not less than 0.6.

16. A phosphor according to claim 1, wherein a brightness keeping percentage of said phosphor is not less than 90%.

17. A light emitting device comprising the phosphor as claimed in claim 1 as a wavelength conversion material, and a semiconductor light emitting element capable of emitting a light in the range of from ultraviolet light to visible light.

18. A light emitting device according to claim 17, further comprising at least one additional phosphor.

19. A light emitting device according to claim 17, wherein a general color rendering index Ra of a light emitted from the light emitting device is not less than 80, and a special color rendering index $R_5$ thereof is not less than 90.

20. A display using the light emitting device as claimed in claim 17 as a light source.

21. A lighting system using the light emitting device as claimed in claim 17 as a light source.

* * * * *

UNITED STATES PATENT AND TRADEMARK OFFICE
CERTIFICATE OF CORRECTION

PATENT NO. : 7,189,340 B2
APPLICATION NO. : 10/776339
DATED : March 13, 2007
INVENTOR(S) : Yasuo Shimomura et al.

Page 1 of 1

It is certified that error appears in the above-identified patent and that said Letters Patent is hereby corrected as shown below:

On the Title Page, Item 30, delete "Item 30" in its entirety.

Signed and Sealed this

Fourteenth Day of April, 2009

JOHN DOLL
*Acting Director of the United States Patent and Trademark Office*